United States Patent [19]
Spaeth

[11] Patent Number: 5,814,870
[45] Date of Patent: Sep. 29, 1998

[54] SEMICONDUCTOR COMPONENT

[75] Inventor: Werner Spaeth, Holzkirchen, Germany

[73] Assignee: Siemens Aktiengesellschaft, Munich, Germany

[21] Appl. No.: 779,366

[22] Filed: Jan. 6, 1997

[30]  Foreign Application Priority Data

Jan. 5, 1996 [DE] Germany ............... 196 00 306.7

[51] Int. Cl.$^6$ ............................................. H01L 31/0203
[52] U.S. Cl. ..................... 257/433; 257/434; 257/666; 257/778
[58] Field of Search ................... 257/433, 434, 257/666, 778

[56]  References Cited

U.S. PATENT DOCUMENTS

| | | | |
|---|---|---|---|
| 4,940,855 | 7/1990 | Waitl et al. ............................ | 174/52.5 |
| 4,982,267 | 1/1991 | Mones et al. ............................ | 257/778 |
| 5,420,460 | 5/1995 | Massingill ............................ | 257/778 |
| 5,424,573 | 6/1995 | Kato et al. ............................ | 257/433 |
| 5,463,229 | 10/1995 | Takase et al. ............................ | 257/434 |
| 5,477,075 | 12/1995 | Forrest et al. ............................ | 257/434 |
| 5,493,151 | 2/1996 | Asada et al. ............................ | 257/666 |
| 5,559,365 | 9/1996 | Kobayashi ............................ | 257/666 |
| 5,616,958 | 4/1997 | Laine et al. ............................ | 257/778 |

FOREIGN PATENT DOCUMENTS

3732075A1  4/1989  Germany .

OTHER PUBLICATIONS

Japanese Patent Abstract No. 61–46053 (Hikino), dated Mar. 6, 1986.

*Primary Examiner*—David Ostrowski
*Attorney, Agent, or Firm*—Herbert L. Lerner; Laurence A Greenberg

[57]  ABSTRACT

A semiconductor component has at least one semiconductor chip mounted on a carrier part of its housing. The semiconductor chip is electrically connected to at least two electrode connectors which are provided with contacts. The component housing has an upper housing portion and at least one housing side part which surround the semiconductor chip at least partially. The carrier part on which the semiconductor chip is mounted forms the upper housing portion of the component housing and the at least two electrode connectors at least partially form the housing side parts of the component housing.

11 Claims, 2 Drawing Sheets

SEMICONDUCTOR COMPONENT

BACKGROUND OF THE INVENTION

FIELD OF THE INVENTION

The invention relates to a semiconductor component and a method for producing a semiconductor component with at least one semiconductor chip which is mounted by a carrier part of a component housing and electrically connected by at least two electrode connectors which are provided with contacts, with the component housing having an upper housing portion and at least one housing side part which surround the semiconductor chip at least partially.

Today, semiconductor integrated circuits are produced with different types of housings, for example, plastic dual-in-line housings with rows of electrode connectors on both sides or surface mountable plastic housings using so-called SMD (Surface Mounted Design) technology. Particularly for optoelectronic components, such as infrared light emitting diodes and the like, processes are known in the art for integrating the semiconductor chip carrying the optoelectronic circuit into a hermetically sealed TO metal component housing.

In this case, the chip carriers consist of metal base plates which are assembled with a metal cover having an integrated glass filter. There have also been proposed in the art mass-produced plastic light-emitting diodes whose optical quality requirements are low and the housing for which consists of a base plate and cover that are cast in one process step and are thus made as one part. The use of light-emitting diodes as dot-shaped light sources, particularly for backlighting symbols or displays requires ever smaller housings. There are limits to the possibilities for miniaturization of the currently standard housings which are made from extrusion coated conductor bands or injection molded plastic because of the mechanical and thermal stability required of the components.

SUMMARY OF THE INVENTION

It is accordingly an object of the invention to provide a semiconductor component and a method for producing a semiconductor component with a component housing to support and protect the semiconductor chip, which overcomes the above-mentioned disadvantages of the heretofore-known devices and methods of this general type; it is the primary object to produce a housing with significantly smaller outside dimensions as compared to the prior art housings economically, even in large quantities, which meets the predetermined requirements for electronic and mechanical properties and at the same time ensures simple storage and handling of the semiconductor component. with the foregoing and other objects in view there is provided, in accordance with the invention, a semiconductor component, comprising:

- a component housing, the housing being formed by a carrier part defining an upper housing portion and at least two housing side parts, the housing side parts being at least partly formed by two electrode connectors; and
- a semiconductor chip disposed in the housing and at least partly surrounded by the carrier part and the electrode connectors, the semiconductor chip being mounted on the carrier part and being electrically connected with the electrode connectors.

In other words, the carrier part on which the semiconductor chip is mounted represents the upper part of the component housing and the at least two electrode connectors which are provided with contacts form at least portions of the component housing side parts. The fact that the semiconductor component electrode connectors, which are provided for the electrical contact of the component with a printed circuit board or the like, also form a part of the component housing permits a significant reduction in size of the component housing of a semiconductor component compared to currently known housing types.

The component housing according to the invention is preferably made by one of the methods known in micromechanics or the production of semiconductor chips such that the outside dimensions of the component housing are on the same order of magnitude as the dimensions of the semiconductor chip itself. The solution according to the invention permits miniaturization of a component housing while simultaneously ensuring the mechanical and thermal stability required for operating and handling semiconductor components.

In accordance with an added feature of the invention, the at least two component housing side parts are micromechanical supports which have a height that is at least slightly higher than the height of the semiconductor chip and which are fixed to edge areas of the carrier surface facing the semiconductor chip. The number and arrangement of the component housing side parts made as micromechanical supports depends on the type and purpose of the electronic circuit formed on the semiconductor chip and the number of required contacts. Although a preferred application of the invention is the production of an optoelectronic semiconductor component, in particular a light-emitting diode with only two contacts, it is possible to provide a plurality of electrically insulated supports forming the component housing side parts, in particular for more complex circuits requiring a corresponding number of contacts for external electrical connection.

In accordance with an additional feature of the invention, the at least two housing side parts are made of an electrically conductive material and are provided with contacts on their free end facing away from the carrier part of the component housing. To avoid a short circuit between the electrically conductive housing parts, such parts are either disposed at a certain distance from each other so that the air layer between them acts as insulation or a preferably thin, electrically insulating layer made, for example, of a plastic material is provided between the housing side parts. The contacts of electrically conductive material which are mounted at the free end of the housing side parts can be in the form of solder pads which are preferably deposited galvanically or by dipping the free end of the housing side parts into a solder bath. These solder pads can then be used to solder the semiconductor component directly to correspondingly formed soldered connections on a printed circuit board.

In accordance with another feature of the invention, the at least two housing side parts are electrically connected with the semiconductor chip mounted on the carrier part of the component housing by means of a connection made from an electrically conductive material on the surface of the carrier part facing the semiconductor chip. The connection made from an electrically conductive material is preferably provided with a metallic printed conductor layer of small thickness, up to approximately 1 $\mu$m, which is formed in one of the photo-lithographic processes used in the production of semiconductor switching devices. For this purpose, a cover or mask layer is deposited over the entire surface of the carrier part facing the semiconductor chip, it is structured, and a metal layer is deposited over the entire surface.

Removing the cover or mask layer with the metallic layer deposited to conform to the edge contours leaves the desired structure of the printed conductors on the surface of the carrier part. In particular, this structure is disposed or formed in bands so as to provide in a simple manner an electrical connection with the associated contact points (pads) on the surface of the semiconductor chip. The embodiment may furthermore provide, in particular, that on the surface of the semiconductor chip which is facing away from the carrier part, additional contact points (bond pads) be formed which are electrically connected by means of bond wires with contact points of the connection.

Particularly for optoelectronic semiconductor components it may be advantageous to form both the printed conductors of the connection disposed on the surface of the carrier part facing the semiconductor chip and the correspondingly associated pads on the surface of the semiconductor chip as thin, preferably parallel tracks, with the tracks of the connection and the tracks of the pads of the semiconductor chip extending perpendicular to each other. This makes it possible to provide a secure electrical and mechanical contact of the connection and the semiconductor chip while taking into account adjusting tolerances and, simultaneously, to decrease loss of light entering or exiting the semiconductor chip due to absorption in the electrically conductive layers.

In accordance with a further feature of the invention, the at least two component housing side parts are made of a material with a coefficient of thermal expansion that is approximately equal to that of the carrier material. This makes it possible to avoid problems regarding mechanical stability of the component when it is bonded to a printed circuit board or the like or in operation during which heat is usually generated.

The carrier part is preferably made of a material that permits hard-soldering or brazing with the electrode connectors. A particularly advantageous material for the carrier part is glass; however, a plastic material, particularly one that is stable at high temperatures, can also be used for the carrier part. The preferred material for the electrode connectors is a semiconductor material, particularly silicon, which may be doped to obtain electrically conductive properties. However, in principle, another electrically conductive material may also be used for the electrode connectors, particularly one whose coefficient of thermal expansion is equal or approximately equal to that of the carrier part material.

The use of glass or an optically transparent or at least translucent plastic material is preferred for the carrier part, particularly if the semiconductor chip which is mounted by its surface that faces the carrier part of the component housing comprises an optoelectronic circuit. In that case, the carrier part, on its surface opposite from the semiconductor chip, can be provided with an optical imaging device, for example a bulk lens, Fresnel lens or diffraction lens. To form the imaging device, a plastic film with a thickness of several $\mu$m is deposited on the upper carrier surface and a die can be used to emboss the appropriate optical structures for imaging a light beam. The imaging device can also be deposited on the upper side of the carrier part by means of molding or casting techniques.

The carrier part of the component housing is preferably made of an electrically insulating material. For special applications, the material of the carrier part can also be electrically conductive; in this case, to prevent a short circuit, a thin insulating layer must be deposited on the surface of the carrier part facing the semiconductor chip before the connection is deposited. For example, when using an optoelectronic semiconductor chip with an IRED (infrared emitting diode) circuit with a lightbeam wavelength of typically $\lambda > 1100$ nm, the carrier part can be made of a semiconductor material, particularly silicon, into which suitable lenses (refractive or diffractive) may be etched if required. In this case, electrical isolation of the anode and cathode of the IRED circuit is preferably achieved by depositing an oxide insulation on the silicon material of the carrier part. Such components are used, in particular, as transmission components in optoelectronic telecommunication systems.

With the above and other objects in view there is also provided, in accordance with the invention, a method of producing a plurality of semiconductor components as described above. The novel method comprises the following steps:

producing a carrier plate from an electrically insulating material, the carrier plate having a first surface for mounting semiconductor chips thereon;

forming a structured connection layer with printed conductor tracks on the first surface of the carrier plate;

producing an electrode connection plate separately from the step of producing the carrier plate;

assigning areas on a surface of the electrode connection plate to the printed conductor tracks, and forming indentations in the assigned areas of the surface of the electrode connection plate; and connecting the first surface of the carrier plate which is provided with connection layer with the surface of the electrode connection plate which is formed with the indentations.

Accordingly, the novel process according to the invention permits simultaneous production of a multiplicity of semiconductor components with a miniaturized component housing. The steps are as follows:

a carrier plate of electrically insulating material is produced;

a structured printed conductor layer with printed conductor tracks or strips is formed on the surface of the carrier plate facing toward the semiconductor chip;

an electrode connection plate is produced separately from the production of the carrier plate;

indentations are formed in the area of the surface of the electrode connection plate assigned to the printed conductors; and the carrier plate surface which is provided with the printed conductor layer and the electrode connection plate surface which is provided with the indentations are joined and attached to one another.

The electrical and mechanical connection of the carrier plate and the electrode connection plate is preferably carried out by means of a soldering step. For this purpose, the carrier plate and the electrode connection plate are aligned with each other such that the printed conductors tracks formed on the carrier plate surface facing the semiconductor chip are properly located with respect to the indentations of the electrode connection plate. Subsequently, the two plates are heated under pressure to a specific temperature, for example 400° C., and soldered together. After joining the two plates, the sections of the electrode connection plate corresponding to the indentations can be removed, in particular by means of a sawing process, and the carrier plate can then be divided to produce the individual semiconductor components, preferably again by a sawing process.

Even before dividing the carrier plate, the contacts, in particular solder pads which are made galvanically or by dipping into a solder bath, can be deposited onto the electrically conductive electrode connectors. Furthermore, subsequently to this step but prior to dividing the carrier plate, the individual semiconductor components can be glued onto a plastic film to facilitate storage and handling of the individual semiconductor components. The semiconductor components can then be individually removed from the plastic film as required and directly deposited onto a printed circuit board or the like and soldered. This is known as the pick and place process.

Other features which are considered as characteristic for the invention are set forth in the appended claims.

Although the invention is illustrated and described herein as embodied in a semiconductor component and method for producing the semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
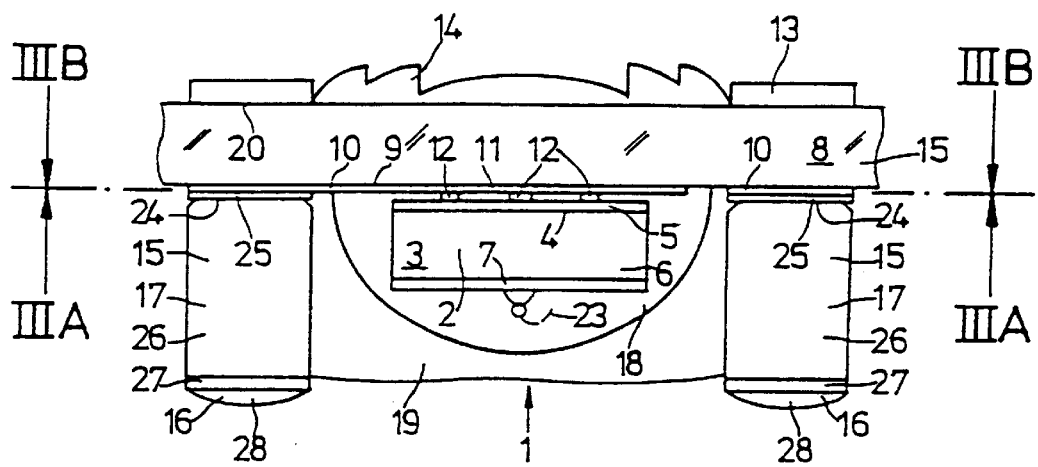
FIG. 1 is a schematic sectional view of a semiconductor component according to an embodiment of the invention with an optoelectronic semiconductor chip.

Referring now to the figures of the drawing in detail and first, particularly, to FIG. 1 thereof, there is seen a semiconductor component 1 in the form of a light-emitting diode with a semiconductor chip 2 having a pn junction 4 formed on a silicon substrate 3 and a p-doped anode layer 5 assigned to the light exit side of the light-emitting diode and an n-doped cathode layer 6 assigned to the rear side of the light-emitting diode and adjoined by a rear-side contacting layer 7. A carrier part 8 is made of glass. A connection 10 is formed on an underside 9 of the carrier part 8 which is made of an electrically conductive material and which has a structure of thin printed conductor tracks 11 extending parallel to each other. The connection 10 is a thin layer made of metal, preferably titanium or chromium-platinum-gold or titanium-palladium-gold, which ensures a good bond with the glass plate 8. Thin contact elements 12 are formed on the anode layer 5 of the semiconductor chip 2 which extend parallel to each other and perpendicular to the direction of printed conductor tracks 11. The semiconductor chip 2 is rigidly attached to the underside 9 of the carrier part 8 such that the printed conductor tracks 11 have a stable electrical contact with the contact elements 12 which extend perpendicular thereto. A plastic layer 13 is deposited upon an upper surface 20 of the carrier part 8, which is transparent for radiation and into which suitable structures for forming a Fresnel lens 14 or another suitable lens system are embossed by a die to provide the desired image of the light beam issuing from the light-emitting diode.

The component housing 15 of the semiconductor component 1 furthermore comprises two electrode connectors 17 which are provided with contacts 16 and which make up the two housing side parts of the component housing 15. The carrier part 8 forms the upper housing portion which closes off the component housing 15 toward the top and, together with the two housing side parts, surrounds and protects the semiconductor chip 2. For protection, the semiconductor chip 2 is coated with a transparent plastic material 18 which also fills the area between the light exit side of the light-emitting diode and the connection 10. The remaining hollow space of the component 1 between the housing side parts is filled with an electrically non-conductive material 19, particularly a plastic material, which does not necessarily have to be transparent.

Figures 3A, 3B:
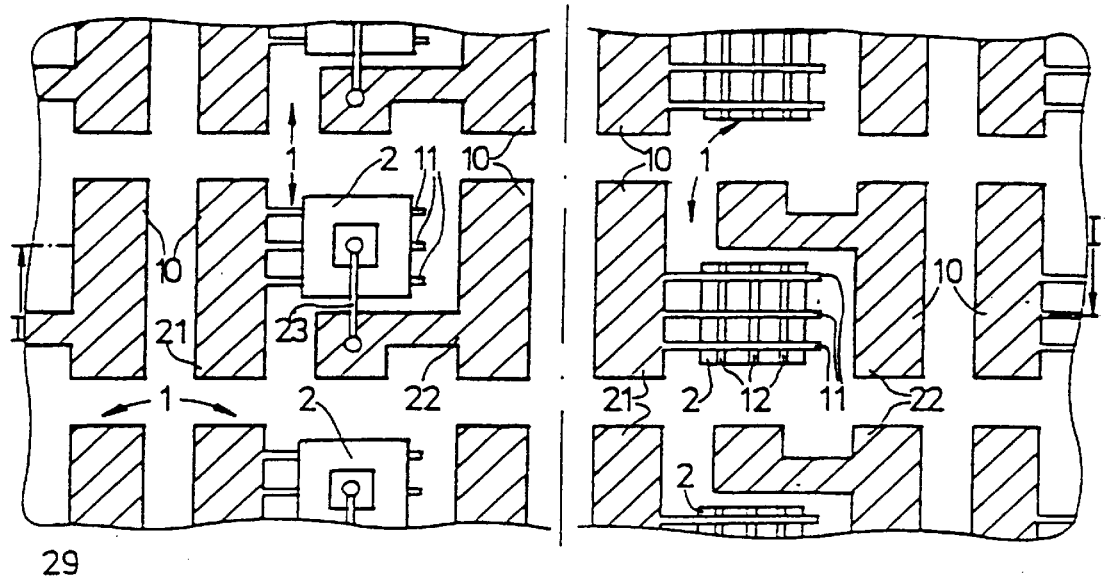
FIG. 3A is a schematic sectional view taken along the line through the component of FIG. 1 and viewed in the direction IIIA—IIIA.
FIG. 3B is a similar section viewed in the direction IIIB—IIIB according to FIG. 1.

The electrically conductive connection 10 is formed as a metallic layer having a thickness of a few microns ($\mu$m). It is deposited on the underside 9 of the carrier part 8 and it is provided with structures by means of photo-techniques. This metallic layer, as is evident particularly from FIGS. 3A and 3B, is provided with a plurality of printed conductor tracks 11 which extend parallel to each other, a connector area 21 which is electrically connected therewith, and a connector area 22 which is electrically connected via a bond wire 23 with the contacting layer 7 deposited on the rear side of the semiconductor chip 2. The connection 10 is preferably a vapor-deposited layer of titanium or chromium-platinum-gold or titanium-palladium-gold formed on the carrier part 8. The connector areas 21 and 22 are formed and dimensioned to match face ends 24 of the electrode connectors 17. The face ends 24 of electrode connectors 17 are coated with a thin metal film 25, particularly gold-silicon, to ensure a mechanically stable and permanent bond by means of hard-soldering or brazing of the electrode connectors 17 on the underside 9 along the edge areas of the carrier part 8.

The electrode connectors 17 are made of an electrically conductive material with substantially the same coefficient of thermal expansion as the material of the carrier part 8. In the illustrated case where glass is used for the carrier part 8, the electrode connectors 17 are made of a semiconductor material, such as silicon, which is doped (e.g. $n^+$ doped) to increase its electrical conductivity. The free ends 26 of the electrode connectors 17 are coated with a metallic interlayer 27 to strengthen the bond with contacts 16, which in the illustrated case is made, for example, of titanium-platinum-tin-palladium. The contacts 16 are disposed on the interlayer 27 in the form of solder pads 28 by means of which the semiconductor component 1 is electrically connected with the soldered connections disposed on a printed circuit board or the like. The electrode connectors 17 form the two housing side parts of the component housing 15 in the form of micromechanical supports, the height of which slightly exceeds the overall height of the semiconductor chip 2. Thus, the total outside dimensions of the semiconductor component 1 according to the invention are on the same order of magnitude as the dimensions of semiconductor chip 2 itself, that is, for example, on the order of magnitude of 500 $\mu$m·500 $\mu$m·100 $\mu$m.

Figure 2:
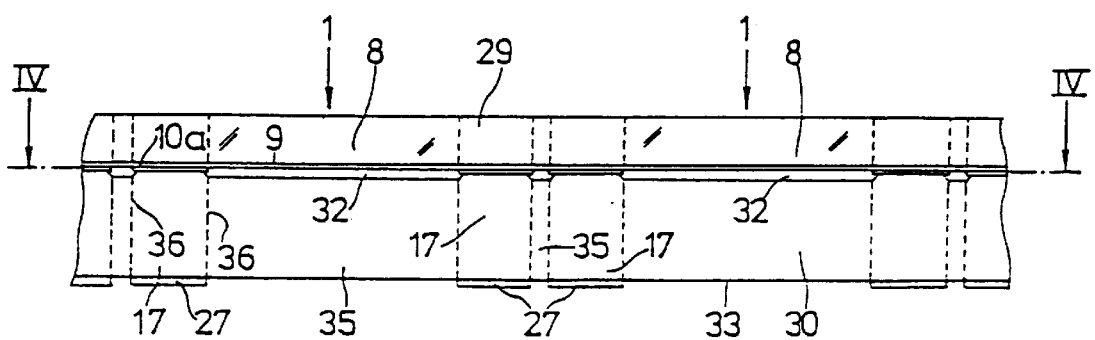
FIG. 2 is a schematic sectional view illustrating the method according to the invention for producing a plurality of semiconductor components according to the exemplary embodiment.
Figure 4:
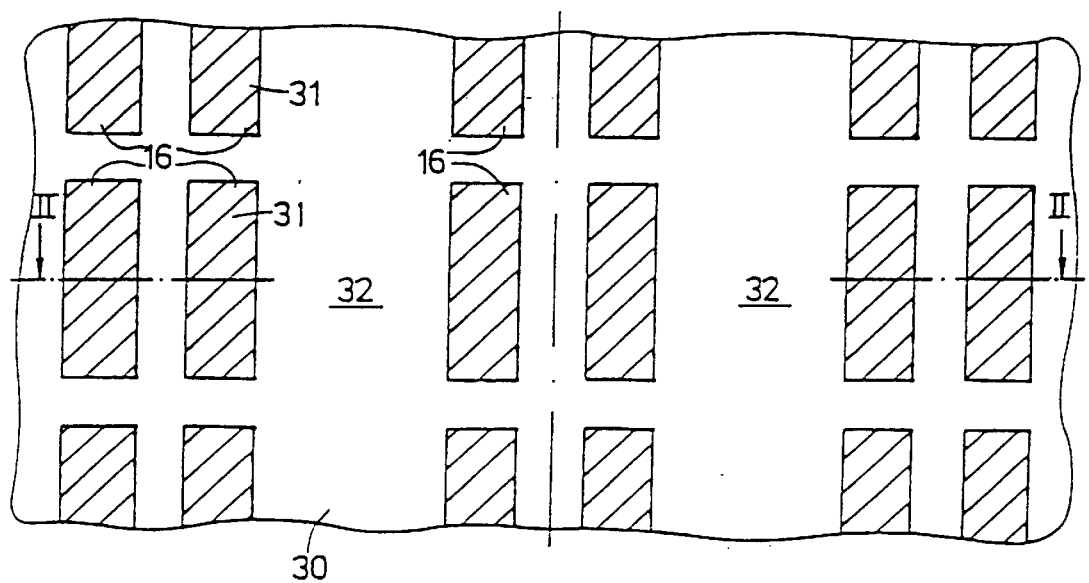
FIG. 4 is a schematic top view in viewing direction IV—IV according to FIG. 2.

The method according to the invention for producing a plurality of semiconductor components with the structural features shown in FIG. 1 is further illustrated with reference to FIGS. 2 and 4. First, a carrier plate 29, preferably made of glass, which is subsequently used to form carrier parts 8 of the individual semiconductor components 1 is provided with an electrically conductive layer of small thickness from which connection 10 is made for the individual semiconductor components 1. For this purpose, a thin metallic layer 10a made of titanium-platinum-gold or titanium-palladium-gold is vapor-deposited over the entire surface 9 of the carrier plate 29 facing semiconductor chip 2. The metallic layer 10a is photolithographically structured in the form shown in FIGS. 3A and 3B. The connections 10 with the printed conductor tracks 11, connector areas 21 and 22 are produced in this manner.

A process step which is separate and independent from the production of the carrier plate 29 produces an electrode connection plate 30 from which the electrode connector 17 is formed for the individual semiconductor components 1. The electrode connection plate 30 preferably consists of a thin silicon wafer having the same outside dimensions as the glass plate 29. First, a thin conductive layer, for example gold-tin, is deposited over the entire surface 20 of the electrode connection plate 30 facing the semiconductor chip 2. Then, a layer of photo-sensitive resist structured by means of a suitable mask is deposited over the thin metal layer so as to obtain the configuration depicted in FIG. 4. In a subsequent etching step, structured photoresist 31 is used as an etching mask to remove those areas of the gold-tin layer which are not covered by the photoresist to form indentations 32 in the surface of electrode connection plate 30. The depth of the indentations 32 is at least slightly greater than the height of the printed conductor tracks 11 and measures, for example, 10 to 50 μm. To complete the electrode connection plate 30, its rear side 33 is provided with the metallic interlayer 27 in an additional photolithographic step in order to strengthen the bond with the contacts 16 which are subsequently deposited.

After its completion, the electrode connection plate 30 is bonded to the carrier plate 29, preferably by hard-soldering or brazing. For this purpose, the two plates 29 and 30 are aligned with respect to each other such that the connector areas 21 and 22 are located over correspondingly formed contacts 34 of the electrode connection plate 30 and the printed conductor tracks 11 are located within the space of the indentations. The two plates are then soldered together under pressure at approximately 400° C. Completing this step results in the arrangement depicted in the schematic sectional view of FIG. 2. Subsequently, sections 35 between the contacts 16 of electrode connection plate 17 are sawed out along a dashed line 36, so as to obtain the electrode connectors 17.

The individual semiconductor chips 2 can then be soldered by their light exit side onto the carrier part 8. For this purpose, the semiconductor chips 2 are heated, preferably by means of a high-power laser. Subsequently, bond wires 23 are used to provide the electrical connection of the rear side contacting layer 7 with the connector area 22. The semiconductor chip 2 is potted with a transparent plastic material which, for improved light extraction, also fills the space between the light exit side of the semiconductor chip 2 and the carrier part 8. A plastic material 19 with a low coefficient of thermal expansion can be added above the transparent plastic material 18, whereby the quantity of material 19 must be exactly matched to the outside dimensions of semiconductor chip 2.

Finally, the solder pads 16 are deposited onto the electrode connectors 17, either galvanically or by dipping into a solder bath, and the carrier plate 29 is glued onto a non-illustrated plastic film and subsequently sawed into the individual semiconductor components.

I claim:

1. A semiconductor component, comprising:
   a component housing, said housing being formed by a carrier part having a first surface and defining an upper housing portion and by at least two housing side parts, said housing side parts being micromechanical supports at least partly formed by two electrode connectors;
   a semiconductor chip of a given height disposed in said housing and mounted on said first surface of said carrier part, said semiconductor chip being at least partly surrounded by said carrier part and said electrode connectors, said semiconductor chip being mounted on said carrier part and being electrically connected with said electrode connectors; and
   contacts disposed on said micromechanical supports on ends thereof distally of said carrier part; and
   wherein said micromechanical supports have a height which slightly exceeds the given height of said semiconductor chip, and said micromechanical supports are affixed laterally of said semiconductor chip on said first surface.

2. The semiconductor component according to claim 1, wherein said at least two micromechanical supports are formed of an electrically conductive material.

3. The semiconductor component according to claim 1, including a connection made of electrically conductive material electrically connecting said housing side parts with said semiconductor chip.

4. The semiconductor component according to claim 3, wherein said carrier part has a first surface on which said semiconductor chip is mounted, and wherein said connection is a printed conductor layer formed on said first surface.

5. The semiconductor component according to claim 1, wherein said carrier part is formed of a material having a given coefficient of thermal expansion, and said housing side parts are made of a material having a coefficient of thermal expansion substantially equal to the given coefficient of thermal expansion.

6. The semiconductor component according to claim 1, wherein said housing side parts are made of a semiconductor material.

7. The semiconductor component according to claim 1, wherein said semiconductor chip includes an optoelectronic circuit on a surface thereof facing said carrier part, and said carrier part is optically transparent at least in a vicinity of said semiconductor chip.

8. The semiconductor component according to claim 7, wherein said carrier part has a first surface on which said semiconductor chip is mounted and a second surface opposite said first surface, and including an optical imaging device on said second surface of said carrier part.

9. The semiconductor component according to claim 1, wherein said semiconductor chip includes an optoelectronic circuit on a surface thereof facing said carrier part, and said carrier part is optically translucent at least in a vicinity of said semiconductor chip.

10. The semiconductor component according to claim 9, wherein said carrier part has a first surface on which said semiconductor chip is mounted and a second surface opposite said first surface, and including an optical imaging device on said second surface of said carrier part.

11. The semiconductor component according to claim 1, wherein said carrier part is an electrically insulating plate formed of one of glass and plastic.

* * * * *